United States Patent [19]
Dinella et al.

[11] 4,282,314
[45] Aug. 4, 1981

[54] MASK FOR SELECTIVELY TRANSMITTING THERETHROUGH A DESIRED LIGHT RADIANT ENERGY

[75] Inventors: Donald Dinella, Berkeley Heights; Ching-Ping Wong, West Windsor Township, Mercer County, both of N.J.

[73] Assignee: Western Electric Co., Inc., New York, N.Y.

[21] Appl. No.: 145,176

[22] Filed: Apr. 30, 1980

Related U.S. Application Data

[60] Division of Ser. No. 79,000, Sep. 26, 1979, which is a continuation of Ser. No. 900,368, Apr. 26, 1978, abandoned.

[51] Int. Cl.$^3$ .................. B29C 17/08; G03C 5/24
[52] U.S. Cl. ........................................ 430/413; 430/5; 430/319; 430/17; 430/9; 156/322; 156/330; 156/268; 430/11
[58] Field of Search .................. 430/5, 312, 17, 318, 430/9, 11, 321, 413, 319, 414; 156/322, 330, 268; 427/316, 171, 282, 296, 14.1, 164, 304, 305, 306; 204/196; 428/422, 337, 461, 515

[56] References Cited

U.S. PATENT DOCUMENTS

| | | | |
|---|---|---|---|
| Re. 29,015 | 10/1976 | De Angelo et al. | 430/319 |
| 3,772,056 | 11/1973 | Polichette et al. | 430/324 |
| 3,772,078 | 11/1973 | Polichette et al. | 428/131 |
| 3,892,900 | 7/1975 | Shima et al. | 428/40 |
| 3,907,621 | 9/1975 | Polichette et al. | 156/656 |
| 3,925,578 | 12/1975 | Polichette et al. | 427/304 |
| 3,930,963 | 1/1976 | Polichette et al. | 430/319 |
| 3,939,027 | 2/1976 | Ohya et al. | 156/322 |
| 3,988,256 | 10/1976 | Vandermey et al. | 252/171 |
| 4,133,908 | 1/1979 | Madsen | 430/413 |
| 4,225,379 | 1/1980 | Ishii et al. | 156/322 |

Primary Examiner—Won H. Louie, Jr.
Attorney, Agent, or Firm—J. F. Spivak

[57] ABSTRACT

A mask for selectively transmitting therethrough a desired light radiant energy is disclosed. The mask comprises a stress-relieved, essentially dimensionally stable base, comprising a copolymer of tetrafluoroethylene and hexafluoropropylene, which is capable of transmitting therethrough the light radiant energy. A blocking film is deposited on at least a portion of the base for blocking the transmission of the light radiant energy through the portion of the base.

8 Claims, No Drawings

MASK FOR SELECTIVELY TRANSMITTING THERETHROUGH A DESIRED LIGHT RADIANT ENERGY

This is a division of application Ser. No. 79,000, filed Sept. 26, 1979, which is a continuation of application Ser. No. 900,368, filed on Apr. 26, 1978, now abandoned.

BACKGROUND OF THE INVENTION

1. Field of the Invention

This invention relates to a mask for selectively transmitting therethrough a desired light radiant energy and more particularly, to a mask comprising a copolymer of tetrafluoroethylene and hexafluoropropylene.

2. Description of the Prior Art

Presently, several techniques for electroless metallization of a surface involve selective light radiation exposure of a pretreated or sensitized surface. For example, U.S. Pat. No. Re. 29,015; U.S. Pat. Nos. 3,772,078 and 3,907,621 disclose such an exposure.

When such techniques are employed as well as any selective photoimaging technique, problems occur with the photomasks which are employed. Typically, quartz masks are employed which are expensive. Additionally, masks, such as quartz masks, are not conforming to irregularities of the surface being masked, thereby leading to problems of non-registry or misregistry as well as poor fine line resolution. Masks having flexible polymeric bases have been employed but these masks suffer from the disadvantage of a variance in their dimension under the influence of temperature and/or humidity in the ambient atmosphere as well as an undesired expansion or contraction due to the heat generated from the light source employed to image a surface.

A photomask which is relatively inexpensive and having excellent thermal dimensional stability, hygroscopic dimensional stability, dimensional stability on standing and the like is needed and is desired.

SUMMARY OF THE INVENTION

This invention relates to a mask for selectively transmitting therethrough a desired light radiant energy and more particularly, to a mask comprising a copolymer of tetrafluoroethylene and hexafluoropropylene.

The mask comprises a stress-relieved, essentially stable base, comprising a copolymer of tetrafluoroethylene and hexafluoropropylene which is capable of transmitting therethrough the light radiant energy. Formed on at least a portion of the base is a blocking film for blocking the transmission of the light radiant energy through the portion of the base.

DETAILED DESCRIPTION

A suitable base is selected. A suitable base comprises a film comprising a copolymer of tetrafluoroethylene and hexafluoropropylene which is capable of transmitting therethrough a desired source of light radiation. Such a copolymer film is commercially available from E. I. DuPont de Nemours and is known as "TEFLON FEP," having a general structural formula of

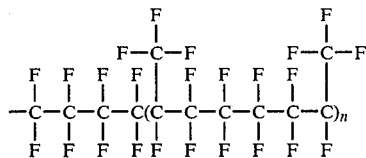

where n is the number of repeated units, and which transmits light radiation having a wavelength ranging from about 2100 A. to about 40,000 A.

The copolymer film base has a thickness within the range of 5 mils to 10 mils. If the copolymer film base is less than 5 mils then it is too flexible and is difficult to handle as a photomask. If the copolymer film base is greater than 10 mils then the ability to transmit therethrough a desired light radiant energy is greatly diminished.

The copolymer film comprising a copolymer of tetrafluoroethylene and hexafluoropropylene, which has not been heat treated, is not suitable for purposes of a mask because of dimensional instability at elevated temperatures. The copolymer film must first be heat treated to stabilize the film dimensionally. If such is not done, then there is a typical dimensional variance of about two percent in the machine direction and about 0.5 percent in the cross section. This variance cannot be tolerated in a photomask. Thus, the copolymer film is heated, using conventional heating means and techniques, e.g., by a radiant oven, at a temperature above which the mask is to be employed, e.g., typically within the range of 80° to 200° C., for a period of time sufficient to relax essentially all the stresses within the film. Typically, for a temperature of 185° C., the time of heating is about 8 days. It is of course understood that the temperature and the time of heating are interdependent upon one another and one skilled in the art can readily ascertain this interdependency for any temperature in the light of the disclosure contained herein.

The heat treated copolymer film is then treated whereby a selected portion has a blocking film formed or deposited thereon. The blocking film comprises a material which blocks the desired radiation destined to be transmitted through other portions of the copolymer film, i.e., the blocking film comprises a material which prevents the transmittance of the desired radiation therethrough. Such a blocking film comprises a metal e.g., copper, nickel, chromium, aluminum, etc., or a non-transmitting plastic film, e.g., nitrocellulose lacquer, vinyl chloride resin containing a dye, etc. Some typical masking plastics are disclosed in U.S. Pat. No. 3,892,900, which masking plastics are applied by means of an adhesive. As a blocking material an adhesive ink can be applied to the film base to form the blocking region.

Typically, the blocking film, comprising a metal, e.g., Cu, Cr, Al, etc., is applied to the copolymer film base by means of conventional vacuum evaporation or by sputtering followed by selective masking, e.g., as with a conventional photoresist, and etching thereof with a suitable etchant, e.g., $HNO_3$ for a copper deposit. Alternatively, a laminate comprising a metal layer adhesively bonded to the copolymer film can be fabricated using conventional laminating procedures, e.g., high pressure and/or high-temperature laminating techniques, and adhesives, e.g., an epoxy adhesive. The metal layer, e.g., copper layer, can then be selectively masked as with a photoresist pattern and then subjected to an etchant to delineate an etched pattern corresponding to the pattern of desired light radiant energy to be transmitted through the resultant mask. It is understood that any conventional technique can be employed, instead of etching, to remove a portion of the blocking film or metal layer to form the desired radiant energy transmitting pattern. Some suitable conventional techniques include abrading techniques and laser milling techniques.

The resultant photomask is particularly suitable for electroless metallization processes involving selective light radiant energy exposure of a surface being metallized. The resultant mask, which is dimensionally stable (thermally and hygroscopically) is most particularly suitable for exposing, by radiant energy, sensitive, non-conductive areas on the surfaces of a substrate which catalyze the deposition of strongly adherent and continuous deposits of electroless metal. U.S. Pat. Nos. 3,772,056; 3,772,078; 3,907,621; 3,925,578 and 3,930,963, all of which are incorporated hereinto by reference, disclose a method of selectively metallizing a surface by coating with a composition comprising at least a reducible salt of a non-noble metal selected from copper, nickel, cobalt or iron, and a radiation-sensitive reducing agent for the salt. The coated composition is then converted, by reduction of the salt by selective exposure to a source of radiant energy, to comprise electrically non-conductive reduced metal species nuclei. The radiation-exposed surface is then subsequently metallized by exposure to an electroless metal deposition solution.

A suitable substrate is first selected, including bodies comprising inorganic and organic substances, such as glass, ceramics, porcelain, resins, paper, cloth, dielectric coated metal or unclad insulating thermosetting resins, thermoplastic resins, etc. A surface of the substrate is selectively deposited with an electrically non-conductive layer or real image comprising nuclei of a metal species, typically the metal, which is capable of catalyzing the deposition of electroless metal from an electroless metal deposition solution with which it is destined to be exposed or treated. The real image typically comprises metal species nuclei, e.g., metal nuclei, in which the metals are selected from Groups VIII and IB of the Periodic Table of Elements. Preferred metals are selected from Period 4 of Groups VIII and IB; iron, cobalt, nickel and copper. Especially preferred for the production of the real image is copper.

In producing the real image, the metal species nuclei are reduced from their salt or a composition of the salt in situ in selected areas on the surface of the substrate by the selective application of light radiant energy, such as ultraviolet light and visible light, X-rays, electron beams, and the like. The reducible metal salt can comprise, in general, a cation selected from the metals of Group VIII and IB Of the Periodic Table of the Elements. The anion associated in such metal salts can vary widely and can comprise organic and inorganic anions such as halides, sulfates, nitrates, formates, gluconates, acetates and the like. The cations in such salts will include copper, nickel, cobalt and iron, in any of the usual degrees of oxidation, e.g., both cuprous and cupric, ferrous and ferric, etc., will serve. Some typical salts include cupric formate, cupric gluconate, cupric acetate, cupric chloride, cupric nitrate, nickel chloride, cobalt chloride, ferrous sulfate and cobalt chloride.

The surface of the substrate, if necessary, is cleaned as described in the patents incorporated hereinto by reference. A sensitizing solution of a reducible metal salt composition, e.g., cupric formate, and a light radiant energy-sensitive reducing agent contained in a suitable solvent, e.g., water, an alcohol, mixtures of water and an alcohol (ethanol, butanol, etc.) is applied to the surface to form a sensitizing solution layer. The coated surface is typically dried and then exposed through the resultant mask, comprising the heat treated copolymer film base, to form the real image on selected portions of the surface. The real image comprises reduced metal salt species nuclei, e.g., copper metal nuclei. The resultant mask is particularly suitable because it readily conforms to irregularities of the substrate surface being masked, as by typically being contact masked, thereby preventing possible misregistry and/or non-registry.

The radiant energy sensitive compound used in association with the reducible metal has the property of decomposing to a compound which will exercise a reducing action on the exposed metal salt. Preferred radiation sensitive compounds are anthraquinone and derivatives thereof, such as 9,10-anthraquinone, β-chloroanthraquinone, β-phenylanthraquinone, 1,2-benzanthraquinone, anthraquinone-2-sulfonic acid, anthraquinone-2,6 (or 2,7)-disulfonic acid and salts thereof, and anthraquinone 2,6-disodium sulfonate, anthraquinone-2,7-disodium sulfonate, anthraquinone-2,7-dipotassium sulfonate, and the like. Particularly preferred are the anthraquinone disulfonic acids and the salts thereof.

A preferred additional ingredient in the treating composition is a secondary reducer, such as an organic, oxygen- or nitrogen-containing compound. Such an ingredient serves to facilitate interaction of radiant energy and the radiant energy-sensitive compound to provide a reduction of the metal salt to the free metal nuclei. Especially preferred as secondary reducing compounds are alcohols or polyols such as lactose, sorbitol, etc.

Additionally, other ingredients known as metal reduction intensifiers/accelerators/stabilizers, described in the patents incorporated hereinto by reference, may be added to the treating sensitizing solution to provide desired effects, such as to speed-up the exposure time, help bring out the real image and provide better contrast, provide anti-fogging, etc. A particularly effective additive has been found to be ferrithiocyanide compounds, e.g., potassium ferrithiocyanide. In addition to the metal reduction image intensifiers/accelerators/stabilizers, the composition comprising the metal salt and the radiant energy-sensitive compound can include also a surfactant, for those surfaces which are hard to wet with the particular sensitizing solution employed.

The treating solution may be formulated within broad concentration ranges within the teachings of the patents incorporated hereinto by reference.

The resultant real image is catalytic to electroless metal deposition and can be processed in known ways for the subsequent build-up of electroless metal plating and, optionally, a top layer of electroplating. The surface having the real image thereon is typically rinsed in running water or otherwise treated to remove the light radiation energy unexposed portions of the non-noble metal ions and then immersed in a suitable electroless metal deposition solution to deposit an electroless metal thereon. The electroless metal deposit may be built-up to a desired thickness by prolonged exposure to the electroless metal deposition solution or, alternatively, may be further built-up by being electroplated in a standard electroplating bath. The various typical electroless metal deposition solutions, electroplating solutions, and plating conditions and procedures are well known in the art and will not be elaborated herein. Reference in this regard is made to U.S. Pat. Nos. 3,772,056; 3,772,078; 3,907,621; 3,925,578 and 3,930,963 incorporated hereinto by reference.

EXAMPLE I

A laminate comprising about a 1.4 mil thick copper layer, a 0.5 mil thick adhesive layer, comprising a modified epoxy, adhesively joining the copper layer to a base layer comprising a 5 mil thick copolymer film of tetrafluoroethylene and hexafluoropropylene ("TEFLON FEP"), was commercially obtained from Circuit Materials Division of Oak Materials Group (designated as "CMC 1117 FEP TEFLON X COPPER LAMINATE"). Prior to the lamination, the copolymer film was heat treated at 185° C. for 8 days.

A commercially obtained photoresist material (obtained from E. I DuPont de Nemours and Company and designated as "RISTON 116S") was applied to the major surface of the copper layer and after storage in the dark for one-half to one hour was selectively exposed to an ultraviolet radiation source for 45 seconds. The exposed photoresist layer was then developed in 1,1,1-trichloroethane at 25° C. for 75 seconds. The resultant photoresist-patterned laminate was rinsed with deionized water for 3 to 5 minutes at 25° C. and then dried with nitrogen gas. The dried, patterned laminate was then immersed in an etchant comprising 40 weight percent aqueous ferric chloride wherein the exposed portions of the copper layer were etched and removed from the laminate thereby exposing the modified epoxy adhesive layer thereat. The photoresist was stripped by immersion in methylene chloride at 25° C. for 30 seconds. The exposed modified epoxy adhesive layer was removed employing the procedure of Ching-Ping Wong's patent application, Ser. No. 900,367, assigned to the assignee hereof and filed on Apr. 26, 1978. Namely, the resultant patterned laminate was immersed in methylene chloride at 25° C. for 2 minutes, followed by immersion in 10 weight percent aqueous ammonium persulfate at 50° C. for 30 to 60 seconds followed by immersion in 98 weight percent aqueous $H_2SO_4$ at 145° C. for 7 seconds. The resultant laminate was then deionized water rinsed for 2 minutes and dried with nitrogen gas. The exposed epoxy was removed. Any photoresist remaining was removed by methylene chloride. A photomask suitable for selectively exposing a surface to a source of light radiant energy was thus obtained.

A substrate comprising a steel core with a fully cured diglycidyl ether of bisphenol A coating thereon was selected. The substrate comprised about 200 through holes having a diameter of about 0.050 inch. The substrate was immersed in a solvent bath comprising a mixture of 90 volume percent methyl ethyl ketone and 10 volume percent methanol for 10 minutes at 25° C. The substrate was water rinsed for 1 minute at 25° C. and then etched in an aqueous solution comprising 300 grams $CrO_3$ and 250 grams $H_2SO_4$ in 1000 ml. of water, maintained at 25° C. for 10 minutes. The etched substrate was then water rinsed at 25° C. for 10 minutes.

A sensitizing solution was prepared by dissolving 10 grams of cupric acetate, 4 grams of 2,6-anthraquinone disulfonic acid disodium salt, and 50 grams of sorbitol in a solvent comprising 950 ml. of $H_2O$. The etched substrate was immersed in the sensitizing solution for one minute at 25° C., removed therefrom and dried at 50° C. for 2 to 4 minutes. A surface of the dried substrate was selectively exposed through the resultant photomask to a high-pressure mercury discharge lamp (30 watts/cm² surface at 3660 A.) for 90 seconds to form a real image capable of catalyzing the electroless deposition of copper metal thereon from an electroless copper deposition solution.

EXAMPLE II

The procedure of EXAMPLE I was repeated except that a laminate having a copper layer adhesively deposited on both opposed major surfaces of the copolymer film was employed. A suitable photomask having a blocking film pattern on both major surfaces was obtained.

EXAMPLE III

A film comprising the copolymer of EXAMPLE I was heated at 185° C. for 8 days. The resultant heat treated film was then placed in a conventional glow discharge apparatus to clean the surface thereof. A 1000 A. thick copper deposit was deposited on both major surfaces of the film by means of a conventional vapor deposition bell jar apparatus at a vacuum of about $10^{-4}$ torr, using a tungsten boat as a heat source.

The resultant copper coated film base was then photoresist coated, developed and etched and the photoresist removed as in EXAMPLE I to produce a suitable photomask.

EXAMPLE IV

The procedure of EXAMPLE III was repeated except that a 1000 A. thick chromium metal film was vacuum deposited on both principal surfaces of the film base. The chromium was selectively etched with a mixture comprising 9 parts of ceric ammonium nitrate $[Ce(NH_4)_2(NO_3)_6]$ and one part of acetic acid at 25° C. for 5 minutes. A suitable photomask was obtained.

EXAMPLE V

The procedure of EXAMPLE III was repeated except that a 1000 A. thick aluminum metal film was deposited on both principal surfaces of the film base. The aluminum was selectively etched with 85 weight percent aqueous $H_3PO_4$ at 25° C. for 1 minute followed by exposure to 1N-sodium hydroxide for 5 minutes. A suitable photomask was obtained.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of fabricating a mask for selectively transmitting therethrough a desired light radiant energy, which comprises:
   (a) heat treating a base comprising a copolymer of tetrafluoroethylene and hexafluoropropylene for a period of time sufficient to render it stress-relieved, essentially dimensionally stable, said base being capable of transmitting therethrough the desired light radiant energy and having a thickness of 5 to 10 mils; and
   (b) selectively forming a blocking film pattern, incapable of transmitting therethrough the desired light radiant energy, on a surface of said heat treated base.

2. The method as defined in claim 1 wherein in step (b) said blocking film pattern is formed by depositing a metal pattern on said surface.

3. The method as defined in claim 1 wherein said blocking film comprises copper metal.

4. A method for selectively depositing a metal on a surface of a substrate, which comprises:
  (a) coating the surface of the substrate with a sensitizing solution comprising at least a reducible salt of a non-noble metal and a radiation sensitive reducing agent for said reducible salt to form a sensitized surface; and
  (b) selectively exposing said sensitized surface through a mask, comprising a base comprising a copolymer of tetrafluoroethylene and hexafluoropropylene, which has been heat treated for a period of time sufficient to render it stress-relieved, essentially dimensionally stable, said base being capable of transmitting therethrough the desired light radiant energy and having a thickness of 5 to 10 mils, and a blocking film formed on at least a portion of said base for blocking the transmission of the light radiant energy through said portion of said base, to a source of light radiant energy to reduce said metal salt to a reduced metal salt species to form a catalytic real image capable of catalyzing the deposition of a metal thereon from an electroless metal deposition solution.

5. The method as defined in claim 4 wherein said blocking film comprises a metal.

6. The method as defined in claim 5 wherein said metal comprises copper.

7. The method as defined in claim 4 wherein said reducible salt comprises a reducible salt of copper and said sensitizing solution additionally comprises a secondary reducer.

8. The method as defined in claim 7 which further comprises exposing said catalytic real image to an electroless metal deposition solution to deposit an electroless metal deposit thereon.

* * * * *